US 12,327,745 B2

(12) United States Patent
Cho et al.

(10) Patent No.: US 12,327,745 B2
(45) Date of Patent: Jun. 10, 2025

(54) TRANSPORT APPARATUS

(71) Applicant: SEMES CO., LTD., Cheonan-si (KR)

(72) Inventors: Jae Ik Cho, Seoul (KR); Kil Hyun Cho, Seongnam-si (KR); Chung Il Cho, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 871 days.

(21) Appl. No.: 17/532,001

(22) Filed: Nov. 22, 2021

(65) Prior Publication Data

US 2022/0165598 A1  May 26, 2022

(30) Foreign Application Priority Data

Nov. 23, 2020  (KR) .................. 10-2020-0158110

(51) Int. Cl.
*H01L 21/677* (2006.01)
*B60L 7/28* (2006.01)
(Continued)

(52) U.S. Cl.
CPC .......... *H01L 21/67724* (2013.01); *B60L 7/28* (2013.01); *B61H 9/02* (2013.01); *B61H 11/02* (2013.01); *B61L 15/0058* (2024.01); *B61L 15/0081* (2013.01); *B65G 1/0457* (2013.01); *B65G 9/008* (2013.01); *B65G 49/07* (2013.01); *H01L 21/67242* (2013.01); *H01L 21/67709* (2013.01); *H01L 21/6773* (2013.01); *H01L 21/67733* (2013.01); *H02K 49/046* (2013.01);
(Continued)

(58) Field of Classification Search
CPC ......... H01L 21/67724; H01L 21/67709; H01L 21/6773; H01L 21/67733; B60L 7/28; B61H 9/02; B61H 11/02; B65G 9/00; B65G 9/002; B65G 9/004; B65G 9/006; B65G 9/008; B65G 49/07; B65G 1/0457; H02K 49/046
USPC .......................................................... 104/18
See application file for complete search history.

(56) References Cited

U.S. PATENT DOCUMENTS 3,483,829 A * 12/1969 Barry .................... B61D 3/188
104/18
6,860,453 B2 * 3/2005 Moretti ............... B61L 15/0081
701/19
(Continued)

FOREIGN PATENT DOCUMENTS

CN       1842431 B  *  5/2010  ............. B06L 13/10
DE  102012009367 A1 *  6/2013  ............. B60T 10/04
(Continued)

OTHER PUBLICATIONS

Korean Office Action with English translation for Korean Patent Application or Patent No. 10-2020-0158110, dated Dec. 26, 2022.
(Continued)

*Primary Examiner* — S. Joseph Morano
*Assistant Examiner* — James William Jones
(74) *Attorney, Agent, or Firm* — KILE PARK REED & HOUTTEMAN PLLC

(57) ABSTRACT

A transport apparatus includes a transport rail extending along a predetermined path, a transport vehicle configured to be movable along the transport rail to transport a material, and a brake unit mounted on the transport vehicle to be adjacent to the transport rail and configured to apply an eddy current braking force to the transport vehicle.

19 Claims, 7 Drawing Sheets

(51) Int. Cl.
*B61H 9/02* (2006.01)
*B61H 11/02* (2006.01)
*B61L 15/00* (2006.01)
*B65G 1/04* (2006.01)
*B65G 9/00* (2006.01)
*B65G 49/07* (2006.01)
*H01L 21/67* (2006.01)
*H02K 49/04* (2006.01)

(52) U.S. Cl.
CPC .............. *B65G 9/002* (2013.01); *B65G 9/004* (2013.01); *B65G 9/006* (2013.01)

(56) References Cited

U.S. PATENT DOCUMENTS

| | | | | |
|---|---|---|---|---|
| 2006/0278478 | A1* | 12/2006 | Pribonic | H02K 49/046 188/161 |
| 2009/0114507 | A1* | 5/2009 | Kitazumi | H01L 21/67736 212/331 |
| 2017/0194181 | A1* | 7/2017 | Chen | G05D 1/0289 |
| 2019/0308820 | A1* | 10/2019 | Andreae | B61B 10/00 |
| 2021/0362957 | A1* | 11/2021 | Hagiwara | H01L 21/67259 |

FOREIGN PATENT DOCUMENTS

| | | | | |
|---|---|---|---|---|
| JP | 09301675 | A * | 11/1997 | |
| JP | 2002-132347 | | 5/2002 | |
| JP | 2003-536351 | | 12/2003 | |
| JP | 2020019302 | A * | 2/2020 | |
| KR | 10-2013-0071228 | | 6/2013 | |
| KR | 20130071228 | A * | 6/2013 | |
| KR | 10-2018-0119967 | | 11/2018 | |
| KR | 10-2018-0136187 | | 12/2018 | |
| KR | 10-2019-0011979 | | 2/2019 | |
| KR | 10-2019-0038328 | | 4/2019 | |
| KR | 20190038328 | A * | 4/2019 | |
| KR | 20190047905 | A * | 5/2019 | |
| KR | 20190063951 | A * | 6/2019 | |
| KR | 20190063957 | A * | 6/2019 | |
| KR | 20190130388 | A * | 11/2019 | |
| WO | WO-2020122718 | A1 * | 6/2020 | .......... B60L 13/006 |

OTHER PUBLICATIONS

Japanese Office Action with Summary in English for Japanese Patent Application No. 2021-188378, dated Jan. 17, 2023.

* cited by examiner

TRANSPORT APPARATUS

CROSS-REFERENCE TO RELATED APPLICATION

This application claims the priority benefit of Korean Patent Application No. 10-2020-0158110, filed on Nov. 23, 2020, and all the benefits accruing therefrom under 35 U.S.C. § 119, the contents of which are incorporated by reference in their entirety.

TECHNICAL FIELD

The present disclosure relates to a transport apparatus. More specifically, the present disclosure relates to a transport apparatus such as an Overhead Hoist Transport (OHT) used to transport materials in a semiconductor device manufacturing process.

BACKGROUND

In a manufacturing process of semiconductor devices, materials such as semiconductor wafers, printed circuit boards, etc. may be transported by a transport apparatus such as an Overhead Hoist Transport (OHT), a Rail Guided Vehicle (RGV), an Automatic Guided Vehicle (AGV), etc.

For example, the OHT apparatus may include a transport vehicle configured to be movable along a transport rail installed on a ceiling portion of a clean room. The transport vehicle may include a drive module configured to be movable on the transport rail and a hoist module connected to a lower portion of the drive module.

The drive module may include a front drive unit including front wheels disposed on the transport rail and a front motor for rotating the front wheels, and a rear drive unit including rear wheels disposed on the transport rail and a rear motor for rotating the rear wheels.

The hoist module may include a hand unit for handling a container such as a Front Opening Unified Pod (FOUP) used to transport the materials, for example, semiconductor wafers, and a hoist unit for elevating the hand unit using an elevating belt.

Meanwhile, vibration may be generated while the transport vehicle moves along the transport rail, and the vibration may cause damage to the transport vehicle and the materials. In addition, when sudden braking is required while the transport vehicle is moving, an overload for the sudden braking of the transport vehicle may be applied to the front and rear motors, thereby causing damage and vibration of the front and rear motors.

SUMMARY

Embodiments of the present invention provide a transport apparatus capable of reducing the vibration of the transport vehicle.

In accordance with an aspect of the present invention, a transport apparatus may include a transport rail extending along a predetermined path, a transport vehicle configured to be movable along the transport rail to transport a material, and a brake unit mounted on the transport vehicle to be adjacent to the transport rail and configured to apply an eddy current braking force to the transport vehicle.

In accordance with some embodiments of the present invention, the transport apparatus may further include a vibration sensor mounted on the transport vehicle and configured to sense vibration of the transport vehicle, and a brake controller for controlling an operation of the brake unit based on a signal from the vibration sensor.

In accordance with some embodiments of the present invention, the brake unit may include an electromagnet mounted on the transport vehicle to be adjacent to the transport rail, and a power supply for applying a brake current to the electromagnet. In such case, the brake controller may control an operation of the power supply based on the signal from the vibration sensor.

In accordance with some embodiments of the present invention, the brake unit may include a permanent magnet mounted on the transport vehicle to be adjacent to the transport rail, and a magnet drive unit for adjusting a gap between the transport rail and the permanent magnet. In such case, the brake controller may control an operation of the magnet drive unit based on the signal from the vibration sensor.

In accordance with another aspect of the present invention, a transport apparatus may include a first transport rail and a second transport rail extending parallel to each other along a predetermined transport path, a transport vehicle comprising a drive module disposed on the first and second transport rails and configured to be movable along the first and second transport rails, and a hoist module connected to the drive module and configured to elevate a material, and brake units mounted on the drive module to be adjacent to the first and second transport rails and configured to apply an eddy current braking force to the drive module.

In accordance with some embodiments of the present invention, the drive module may include a front drive unit comprising front wheels respectively disposed on the first and second transport rails, and a rear drive unit comprising rear wheels respectively disposed on the first and second transport rails, and the brake units may include a front brake unit mounted on the front drive unit, and a rear brake unit mounted on the rear drive unit.

In accordance with some embodiments of the present invention, the transport apparatus may further include a front vibration sensor mounted on the front drive unit and configured to sense vibration of the front drive unit, a rear vibration sensor mounted on the rear drive unit and configured to sense vibration of the rear drive unit, and a brake controller for controlling an operation of the front brake unit based on a signal from the front vibration sensor and controlling an operation of the rear brake unit based on a signal from the rear vibration sensor.

In accordance with some embodiments of the present invention, the front brake unit may include a first electromagnet disposed adjacent to the first transport rail, a second electromagnet disposed adjacent to the second transport rail, and a first power supply for applying a first brake current to the first electromagnet and the second electromagnet. The rear brake unit may include a third electromagnet disposed adjacent to the first transport rail, a fourth electromagnet disposed adjacent to the second transport rail, and a second power supply for applying a second brake current to the third electromagnet and the fourth electromagnet. In such case, the brake controller may control the first and second brake currents based on the signals from the first and second vibration sensors, respectively.

In accordance with some embodiments of the present invention, the front brake unit may include a first permanent magnet disposed adjacent to the first transport rail, a second permanent magnet disposed adjacent to the second transport rail, and a first magnet drive unit for adjusting a gap between the first transport rail and the first permanent magnet and a gap between the second transport rail and the second permanent magnet. The rear brake unit may include a third permanent magnet disposed adjacent to the first transport rail, a fourth permanent magnet disposed adjacent to the second transport rail, and a second magnet drive unit for adjusting a gap between the first transport rail and the third permanent magnet and a gap between the second transport rail and the fourth permanent magnet. In such case, the brake controller may control operations of the first and second magnet drive units based on the signals from the first and second vibration sensors, respectively.

In accordance with some embodiments of the present invention, the front brake unit may include a first permanent magnet disposed adjacent to the first transport rail, a first electromagnet disposed on one side of the first permanent magnet, first pole pieces connecting ends of the first permanent magnet and the first electromagnet to each other, a second permanent magnet disposed adjacent to the second transport rail, a second electromagnet disposed on one side of the second permanent magnet, second pole pieces connecting ends of the second permanent magnet and the second electromagnet to each other, and a first power supply for applying a first brake current to the first electromagnet and the second electromagnet. The rear brake unit may include a third permanent magnet disposed adjacent to the first transport rail, a third electromagnet disposed on one side of the third permanent magnet, third pole pieces connecting ends of the third permanent magnet and the third electromagnet to each other, a fourth permanent magnet disposed adjacent to the second transport rail, a fourth electromagnet disposed on one side of the fourth permanent magnet, fourth pole pieces connecting ends of the fourth permanent magnet and the fourth electromagnet to each other, and a second power supply for applying a second brake current to the third electromagnet and the fourth electromagnet. In such case, the brake controller may control the first and second brake currents based on the signals from the first and second vibration sensors, respectively.

In accordance with some embodiments of the present invention, the transport apparatus may further include an obstacle detection sensor mounted on a front portion of the transport vehicle and configured to detect an obstacle in front of the transport vehicle, and a brake controller configured to control operations of the brake units so that the eddy current braking force is applied to the drive module by the brake units when the obstacle is detected by the obstacle detection sensor while the transport vehicle is moving.

In accordance with some embodiments of the present invention, the transport apparatus may further include a second brake unit mounted on the hoist module to be adjacent to the first and second transport rails and configured to apply an eddy current braking force to the hoist module.

In accordance with some embodiments of the present invention, the transport apparatus may further include a lower vibration sensor mounted on the hoist module and configured to sense vibration of the hoist module, and a brake controller for controlling an operation of the second brake unit based on a signal from the lower vibration sensor.

In accordance with some embodiments of the present invention, the drive module may include a front drive unit including front wheels respectively disposed on the first and second transport rails, a front motor for rotating the front wheels, and a front servo drive for controlling a torque of the front motor, a rear drive unit including rear wheels respectively disposed on the first and second transport rails, a rear motor for rotating the rear wheels, and a rear servo drive for controlling a torque of the rear motor, and a motion controller for providing a torque command to the front servo drive and the rear servo drive.

In accordance with some embodiments of the present invention, the front drive unit may further include a front encoder for measuring a number of revolutions of the front motor, and the rear drive unit may further include a rear encoder for measuring a number of revolutions of the rear motor. In such case, the motion controller may control operations of the front and rear motors in a feedback manner based on a signal of any one of the front and rear encoders.

In accordance with some embodiments of the present invention, the motion controller may control the operations of the front and rear motors in the feedback manner based on a signal from the front encoder when the transport vehicle accelerates or when the transport vehicle moves upward in an uphill section of the first and second transport rails.

In accordance with some embodiments of the present invention, the motion controller may control the operations of the front and rear motors in the feedback manner based on a signal from the rear encoder when the transport vehicle decelerates or when the transport vehicle moves downward in a downhill section of the first and second transport rails.

In accordance with some embodiments of the present invention, the transport apparatus may further include a brake controller for controlling operations of the brake units. In such case, the motion controller may provide a brake command to the brake controller to decelerate or stop the transport vehicle, and the brake controller may control the operations of the brake units so that the eddy current braking force is applied to the drive module according to the brake command.

In accordance with some embodiments of the present invention, the transport apparatus may further include an obstacle detection sensor mounted on a front portion of the transport vehicle and configured to detect an obstacle in front of the transport vehicle, and a brake controller for controlling operations of the brake units. In such case, the motion controller may provide a brake command to the brake controller to decelerate or stop the transport vehicle when the obstacle is detected by the obstacle detection sensor, and the brake controller may control the operations of the brake units so that the eddy current braking force is applied to the drive module according to the brake command.

In accordance with still another aspect of the present invention, a transport apparatus may include a first transport rail and a second transport rail extending parallel to each other along a predetermined transport path, a transport vehicle comprising a drive module disposed on the first and second transport rails and configured to be movable along the first and second transport rails, and a hoist module connected to the drive module and configured to elevate a material, brake units mounted on the drive module to be adjacent to the first and second transport rails and configured to apply an eddy current braking force to the drive module, a second brake unit mounted on the hoist module to be adjacent to the first and second transport rails and configured to apply an eddy current braking force to the hoist module, at least one vibration sensor mounted on the transport vehicle and configured to sense vibration of the transport vehicle, and a brake controller for controlling operations of the brake units and the second brake unit based on a signal from the at least one vibration sensor.

In accordance with the embodiments of the present invention as described above, vibration generated during movement of the transport vehicle may be reduced by the eddy current braking force provided by the front and rear brake units. Further, when the deceleration or stop of the transport vehicle is required, the time required for braking the transport vehicle may be significantly reduced by the front and rear brake units. Particularly, when sudden braking of the transport vehicle is required, the braking time may be shortened by the front and rear brake units, and the vibration of the transport vehicle may be significantly reduced by the front and rear brake units.

The above summary of the invention is not intended to describe each illustrated embodiment or every implementation of the present invention. The detailed description and claims that follow more particularly exemplify these embodiments.

BRIEF DESCRIPTION OF THE DRAWINGS

Embodiments of the present invention can be understood in more detail from the following description taken in conjunction with the accompanying drawings, in which.

Figure 1:
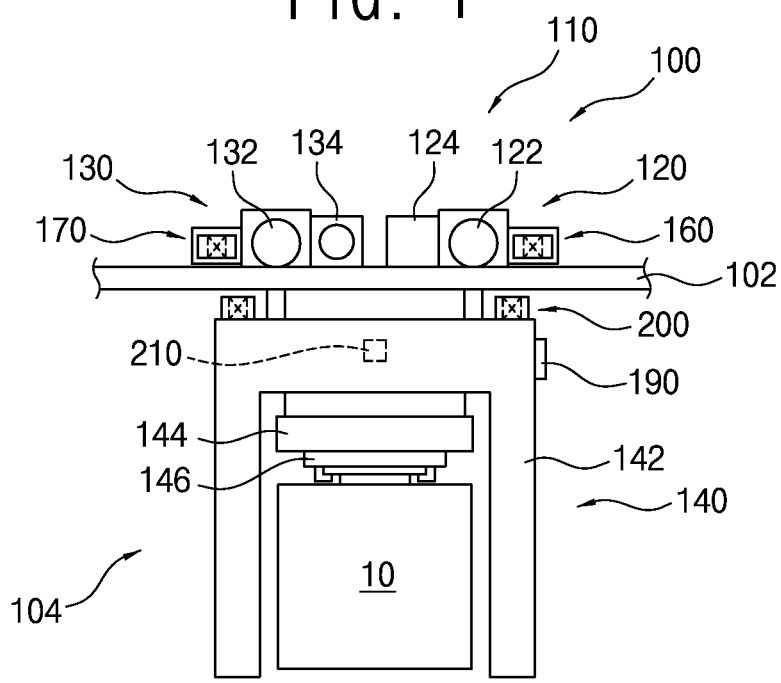
FIG. 1 is a schematic side view illustrating a transport apparatus in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
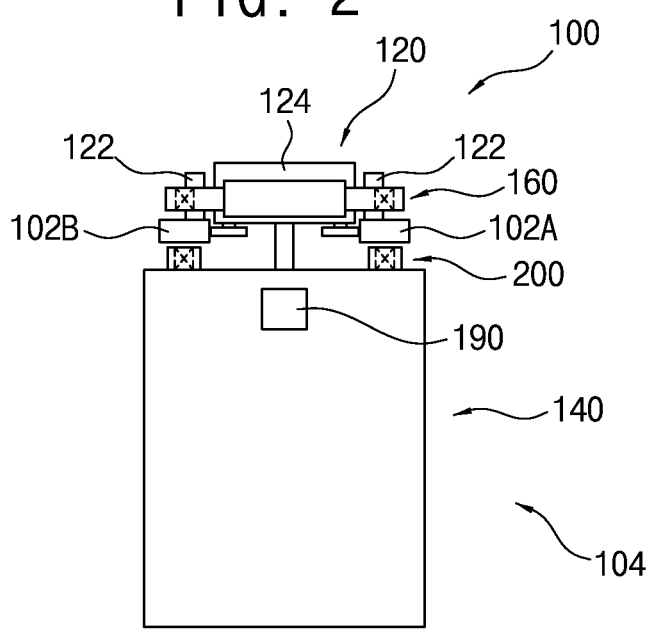
FIG. 2 is a schematic front view illustrating the transport apparatus as shown in FIG. 1.

FIG. 1 is a schematic side view illustrating a transport apparatus in accordance with an embodiment of the present invention. FIG. 2 is a schematic front view illustrating the transport apparatus as shown in FIG. 1, and FIG. 3 is a schematic plan view illustrating a drive module as shown in FIG. 1.

Figure 3:
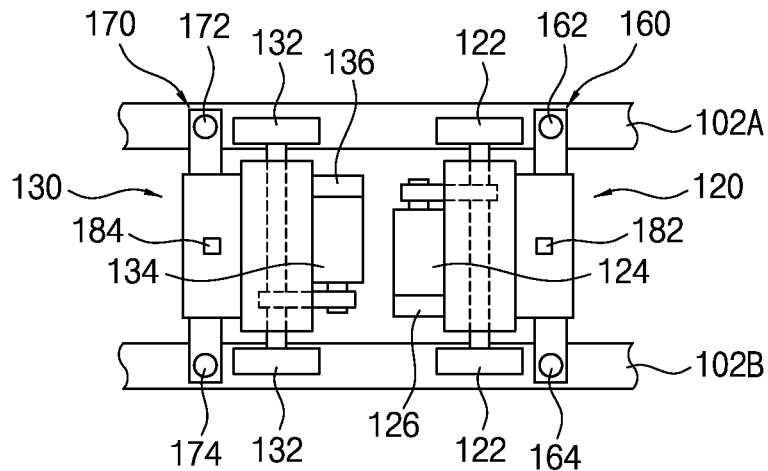
FIG. 3 is a schematic plan view illustrating a drive module as shown in FIG. 1.

Referring to FIGS. 1 to 3, a transport apparatus 100, in accordance with an embodiment of the present invention, may be used to transport a material 10 such as a semiconductor wafer or a printed circuit board in a semiconductor device manufacturing process. For example, the transport apparatus 100 may be an OHT apparatus, and may be used to transport a container 10 such as a FOUP in which semiconductor wafers are accommodated, a magazine in which printed circuit boards are accommodated, and the like.

The transport apparatus 100 may include a transport rail 102 extending along a predetermined path in a clean room, and a transport vehicle 104 configured to be movable along the transport rail 102. The transport vehicle 104 may include a drive module 110 configured to be movable on the transport rail 102, and a hoist module 140 connected to a lower portion of the drive module 110 and configured to elevate the material 10. For example, the transport apparatus 100 may include a first transport rail 102A and a second transport rail 102B extending parallel to each other along a predetermined transport path, and the drive module 110 may include a front drive unit 120 including front wheels 122 respectively disposed on the first and second transport rails 102A and 102B, and a rear drive unit 130 including rear wheels 132 respectively disposed on the first and second transport rails 102A and 102B.

The front drive unit 120 may include a front motor 124 for rotating the front wheels 122 and a front servo drive 128 (refer to FIG. 4) for applying a drive current to the front motor 124. The rear drive unit 130 may include a rear motor 134 for rotating the rear wheels 132 and a rear servo drive 138 (refer to FIG. 4) for applying a drive current to the rear motor 134. Further, the front drive unit 120 may include a front encoder 126 (refer to FIG. 4) for measuring the number of revolutions of the front motor 124, and the rear drive unit 130 may include a rear encoder 136 (refer to FIG. 4) for measuring the number of revolutions of the rear motor 134.

The hoist module 140 may be connected to lower portions of the front and rear drive units 120 and 130, and may include a housing 142 having an internal space for accommodating the material 10 and a hoist unit 144 disposed in the housing 142 and for elevating the material 10. The hoist unit 144 may include a hand unit 146 for gripping the material 10 and may vertically move the hand unit 146 using an elevating belt (not shown).

Figure 4:
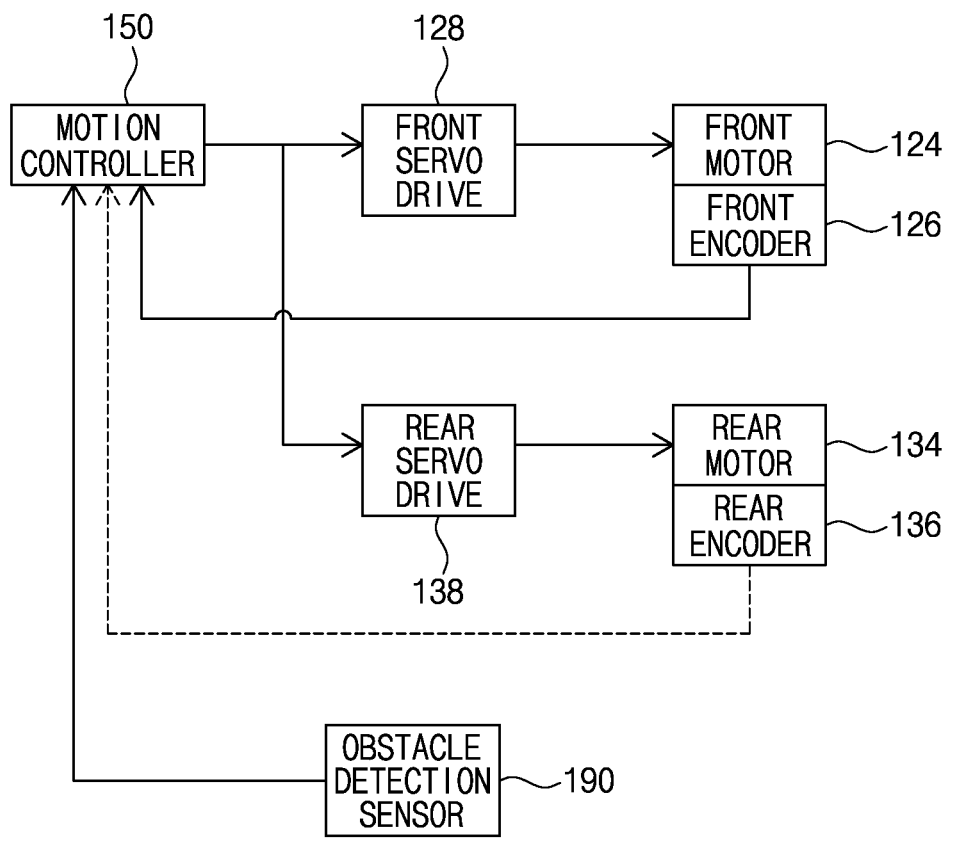
FIG. 4 is a block diagram illustrating a motion controller for controlling operations of a front motor and a rear motor as shown in FIG. 1.

FIG. 4 is a block diagram illustrating a motion controller for controlling operations of the front motor and the rear motor as shown in FIG. 1.

Referring to FIG. 4, the operations of the front motor 124 and the rear motor 134 may be controlled by a motion controller 150. The motion controller 150 may generate a speed profile for controlling the operations of the front and rear motors 124 and 134 by using a position command provided from a higher-level controller such as an OHT Control System (OCS), and may perform position control and speed control of the front and rear motors 124 and 134 using the speed profile. Further, the motion controller 150 may provide a torque command to the front and rear servo drives 128 and 138. The front and rear servo drives 128 and 138 may apply the drive current to the front and rear motors 124 and 134 according to the torque command, and may perform feedback control on the drive current.

Particularly, the motion controller 150 may control the operations of the front and rear motors 124 and 134 in a feedback manner based on a signal from the front encoder 126 or the rear encoder 136. For example, the motion controller 150 may select any one of the front and rear encoders 126 and 136, and may control the operations of the front and rear motors 124 and 134 in a feedback manner based on a signal received from the selected encoder (126 or 136).

For example, when the transport vehicle 104 accelerates, a load applied to the front wheels 122 due to inertia may be greater than a load applied to the rear wheels 132. As a result, a grip force of the front wheels 122 may be increased compared to a grip force of the rear wheels 132, and thus a slip phenomenon of the front wheels 122, that is, a sliding phenomenon of the front wheels 122 on the first and second transport rails 102A and 102B may be reduced compared to the rear wheels 132. Accordingly, when the transport vehicle 104 accelerates, the motion controller 150 may control the operations of the front and rear motors 124 and 134 in a feedback manner based on a signal from the front encoder 126. Further, when the transport vehicle 104 moves upward in an uphill section of the first and second transport rails 102A and 102B, a load applied to the front wheels 122 may be increased by the weight of the transport vehicle 104, and thus the motion controller 150 may control the operations of the front and rear motors 124 and 134 in the feedback manner based on the signal from the front encoder 126.

As another example, when the transport vehicle 104 decelerates, a load applied to the rear wheels 132 due to inertia may be greater than a load applied to the front wheels 122. As a result, a grip force of the rear wheels 132 may be increased compared to a grip force of the front wheels 122, and thus a slip phenomenon of the rear wheels 132, that is, a sliding phenomenon of the rear wheels 132 on the first and second transport rails 102A and 102B may be reduced compared to the front wheels 122. Accordingly, when the transport vehicle 104 decelerates, the motion controller 150 may control the operations of the front and rear motors 124 and 134 in a feedback manner based on a signal from the rear encoder 136.

Further, when the transport vehicle 104 moves downward in a downhill section of the first and second transport rails 102A and 102B, a load applied to the rear wheels 132 may be increased by the weight of the transport vehicle 104, and thus the motion controller 150 may control the operations of the front and rear motors 124 and 134 in the feedback manner based on the signal from the rear encoder 136.

On the other hand, when the transport vehicle 104 maintains a constant speed, a load applied to the front wheels 122 and a load applied to the rear wheels 132 are similar to each other, so that the motion controller 150 may selectively use any one of the front and rear encoders 126 and 136. For example, when the transport vehicle 104 maintains a constant speed, the motion controller 150 may control the operations of the front and rear motors 124 and 134 in a feedback manner using a signal from the front encoder 126.

As described above, the operations of the front and rear motors 124 and 134 may be controlled based on the number of revolutions of the motor (124 or 134) connected to the wheels (122 or 132) with a relatively small slip phenomenon. Accordingly, the vibration of the transport vehicle 104 that may be caused by a slip phenomenon of the front wheels 122 and/or the rear wheels 132 may be significantly reduced.

Referring again to FIGS. 1 to 3, the transport apparatus 100, in accordance with an embodiment of the present invention, may include brake units 160 and 170 mounted on the drive module 110 to be adjacent to the first and second transport rails 102A and 102B, and for applying an eddy current braking force to the drive module 110. For example, the transport apparatus 100 may include a front brake unit 160 mounted on the front drive unit 120 and a rear brake unit 170 mounted on the rear drive unit 130.

Figure 5:
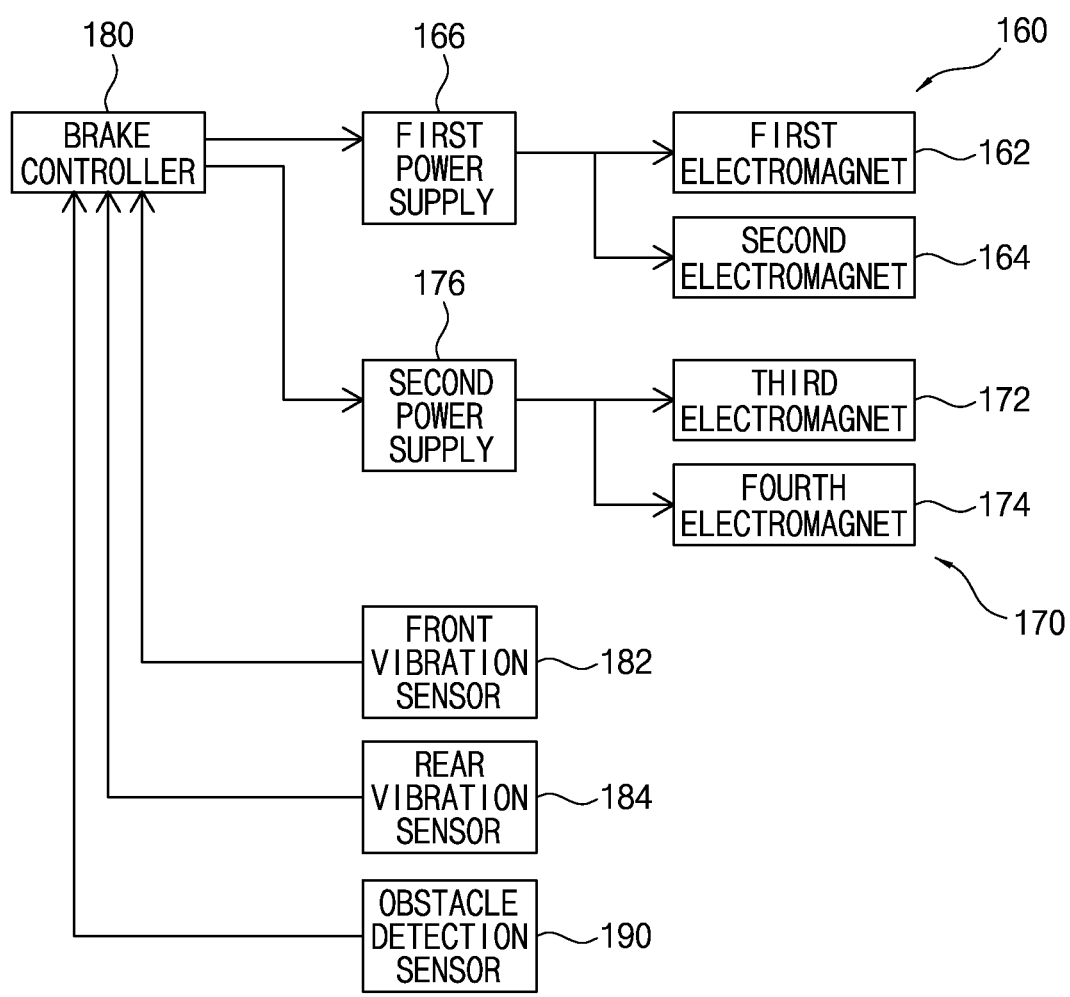
FIG. 5 is a block diagram illustrating a front brake unit and a rear brake unit as shown in FIG. 1.

FIG. 5 is a block diagram illustrating the front brake unit and the rear brake unit as shown in FIG. 1.

Referring to FIG. 5, the front and rear brake units 160 and 170 may include electromagnets 162, 164, 172 and 174 disposed adjacent to the first and second transport rails 102A and 102B, and power supplies 166 and 176 for applying a brake current to the electromagnets 162, 164, 172 and 174. Further, the transport apparatus 100 may include a front vibration sensor 182 mounted on the front drive unit 120 and configured to sense vibration of the front drive unit 120, a rear vibration sensor 184 mounted on the rear drive unit 130 and configured to sense vibration of the rear drive unit 130, and a brake controller 180 for controlling an operation of the front brake unit 160 based on a signal from the front vibration sensor 182 and controlling an operation of the rear brake unit 170 based on a signal from the rear vibration sensor 184.

For example, the front brake unit 160 may include a first electromagnet 162 disposed adjacent to the first transport rail 102A, a second electromagnet 164 disposed adjacent to the second transport rail 102B, and a first power supply 166 for applying a first brake current to the first electromagnet 162 and the second electromagnet 164. The rear brake unit 170 may include a third electromagnet 172 disposed adjacent to the first transport rail 102A, a fourth electromagnet 174 disposed adjacent to the second transport rail 102B, and a second power supply 176 for applying a second brake current to the third electromagnet 172 and the fourth electromagnet 174. The brake controller 180 may control the first and second brake currents based on the signals from the first and second vibration sensors 182 and 184, respectively.

The first and third electromagnets 162 and 172 may be disposed to be spaced apart from an upper surface of the first transport rail 102A by a predetermined distance, and the second and fourth electromagnets 164 and 174 may be disposed to be spaced apart from an upper surface of the second transport rail 102B by a predetermined distance. As another example, although not shown, the first and third electromagnets 162 and 172 may be disposed to be spaced apart from an inner surface of the first transport rail 102A by a predetermined distance, and the second and fourth electromagnets 164 and 174 may be disposed to be spaced apart from an inner surface of the second transport rail 102B by a predetermined distance.

While the transport vehicle 104 is moving, the vibration of the front drive unit 120 may be measured by the front vibration sensor 182. The brake controller 180 may provide a first control signal to the first power supply 166 according to a vibration signal measured by the front vibration sensor 182, and the first power supply 166 may apply the first brake current to the first and second electromagnets 162 and 164 according to the first control signal. By applying the first brake current, the first and second electromagnets 162 and 164 may generate a first eddy current braking force, and thus the vibration of the front drive unit 120 may be quickly removed by the first eddy current braking force. In particular, the brake controller 180 may control the first brake current in a feedback manner based on the signal from the front vibration sensor 182.

Further, while the transport vehicle 104 is moving, the vibration of the rear drive unit 130 may be measured by the rear vibration sensor 184. The brake controller 180 may provide a second control signal to the second power supply 176 according to a vibration signal measured by the rear vibration sensor 184, and the second power supply 176 may apply the second brake current to the third and fourth electromagnets 172 and 174 according to the second control signal. By applying the second brake current, the third and fourth electromagnets 172 and 174 may generate a second eddy current braking force, and thus the vibration of the rear drive unit 130 may be quickly removed by the second eddy current braking force. In particular, the brake controller 180 may control the second brake current in a feedback manner based on the signal from the rear vibration sensor 184.

In accordance with an embodiment of the present invention, the transport apparatus 100 may include an obstacle detection sensor 190 mounted on a front portion of the transport vehicle 104 and configured to detect an obstacle in front of the transport vehicle 104.

For example, the obstacle detection sensor 190 may be mounted on a front surface portion of the hoist module 140, and may detect a preceding transport vehicle (not shown) moving at a low speed or in a stationary state in front of the transport vehicle 104.

When the obstacle is detected by the obstacle detection sensor 190, a detection signal of the obstacle detection sensor 190 may be transmitted to the brake controller 180. In such case, the brake controller 180 may control the operations of the front and rear brake units 160 and 170 to decelerate or stop the transport vehicle 104. Specifically, the brake controller 180 may control the operations of the front and rear brake units 160 and 170 based on the signal of the obstacle detection sensor 190 so that the first eddy current braking force and the second eddy current braking force are applied to the front drive unit 120 and the rear drive unit 130, respectively.

Further, as shown in FIG. 4, the signal of the obstacle detection sensor 190 may be transmitted to the motion controller 150. In such case, the motion controller 150 may generate a speed profile for decelerating or stopping the transport vehicle 104, and may control the operations of the front and rear motors 124 and 134 using the speed profile so that the transport vehicle 104 decelerates or stops. In particular, the transport vehicle 104 may be decelerated or stopped faster than the prior art by the front and rear brake units 160 and 170. Further, the vibration generated during deceleration or stopping of the transport vehicle 104 may be quickly removed by the front and rear brake units 160 and 170.

Figure 6:
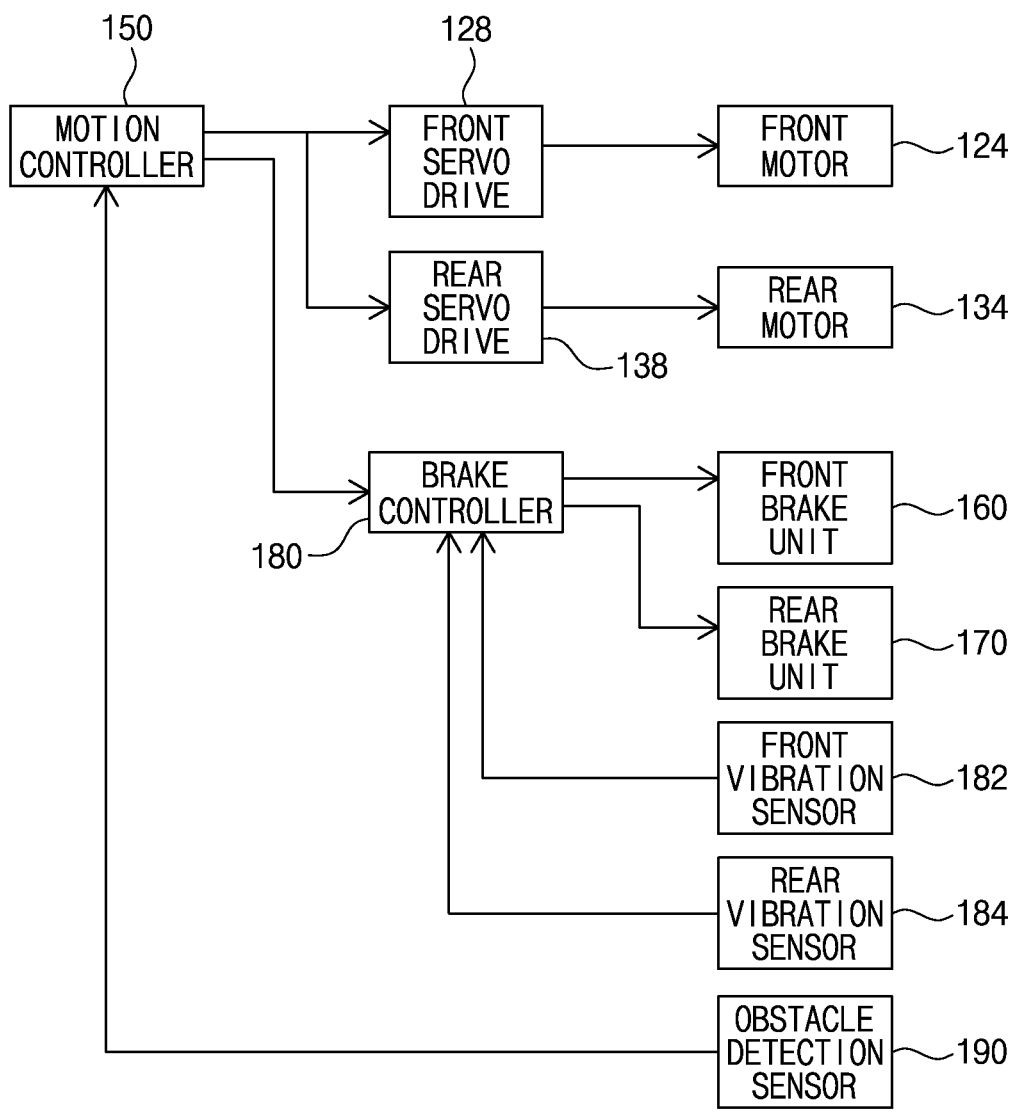
FIG. 6 is a block diagram illustrating another example of operating a motion controller and a brake controller as shown in FIGS. 4 and 5.

FIG. 6 is a block diagram illustrating another example of operating the motion controller and the brake controller as shown in FIGS. 4 and 5.

Referring to FIG. 6, the motion controller 150 may generate a torque command for controlling the operations of the front and rear motors 124 and 134, and may provide the torque command to the front and rear serve drives 128 and 138 in order to decelerate the transport vehicle 104 or stop the transport vehicle 104 at a predetermined position. Further, the motion controller 150 may provide a brake command for deceleration or stopping of the transport vehicle 104 to the brake controller 180. The brake controller 180 may control the operations of the front and rear brake units 160 and 170 according to the brake command so that the first eddy current braking force and the second eddy current braking force are applied to the front drive unit 120 and the rear drive unit 130.

In addition, when the obstacle is detected by the obstacle detection sensor 190, the motion controller 150 may control the operations of the front and rear motors 124 and 134 to decelerate or stop the transport vehicle 104, and may provide a brake command for deceleration or stopping of the transport vehicle 104 to the brake controller 180. The brake controller 180 may control the operations of the front and rear brake units 160 and 170 according to the brake command so that the first eddy current braking force and the second eddy current braking force are applied to the front drive unit 120 and the rear drive unit 130. Accordingly, a collision between the transport vehicle 104 and the obstacle may be prevented.

In particular, when the preceding transport vehicle is in a stationary state in front of the transport vehicle 104, sudden braking of the transport vehicle 104 may be required. In such case, the transport vehicle 104 may be suddenly braked by the motion controller 150 and the brake controller 180. Even when the transport vehicle 104 is suddenly braked as described above, the vibration of the transport vehicle 104 may be reduced by the front and rear brake units 160 and 170, and thus damage to the material 10 due to the sudden braking may be sufficiently prevented.

Referring again to FIGS. 1 to 3, the transport apparatus 100 may include a second brake unit 200 mounted on the hoist module 140 to be adjacent to the first and second transport rails 102A and 102B and for applying an eddy current braking force to the hoist module 140. The second brake unit 200 may be used to reduce vibration of the hoist module 140, and an operation of the second brake unit 200 may be controlled by the brake controller 180.

For example, a lower vibration sensor 210 for detecting the vibration of the hoist module 140 may be mounted on the hoist module 140, and the brake controller 180 may control the operation of the second brake unit 200 based on a measurement signal of the lower vibration sensor 210. As an example, the second brake unit 200 may include lower electromagnets (not shown) disposed to be adjacent to the first and second transport rails 102A and 102B on the hoist module 140, and a lower power supply (not shown) for applying a brake current to the lower electromagnets. The brake controller 180 may control the brake current applied to the lower electromagnets based on the measurement signal from the lower vibration sensor 210.

Figure 7:
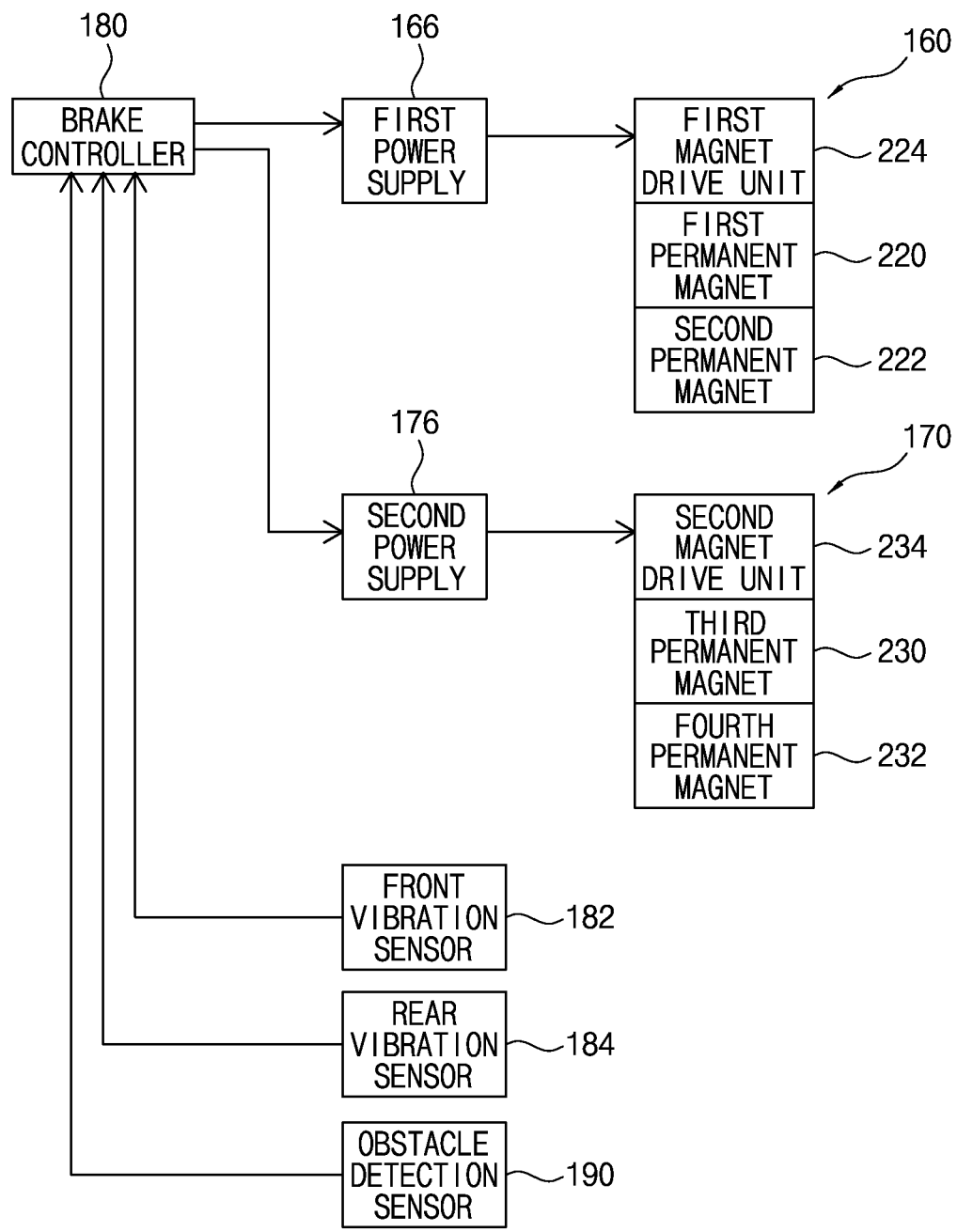
FIG. 7 is a block diagram illustrating another example of the front brake unit and the rear brake unit as shown in FIG. 1.

FIG. 7 is a block diagram illustrating another example of the front brake unit and the rear brake unit as shown in FIG. 1.

Referring to FIG. 7, the front brake unit 160 a first permanent magnet 220 disposed adjacent to the first transport rail 102A, a second permanent magnet 222 disposed adjacent to the second transport rail 102B, and a first magnet drive unit 224 for adjusting a gap between the first transport rail 102A and the first permanent magnet 220 and a gap between the second transport rail 102B and the second permanent magnet 222. For example, the first permanent magnet 220 may be disposed to be spaced apart from the upper surface or the inner surface of the first transport rail 102A by a predetermined distance, and the second permanent magnet 222 may be disposed to be spaced apart from the upper surface or the inner surface of the second transfer rail 102B by a predetermined distance. The first magnet drive unit 224 may adjust the gap between the first transport rail 102A and the first permanent magnet 220 and the gap between the second transport rail 102B and the second permanent magnet 222 using a linear motor, a solenoid actuator, or the like.

The rear brake unit 170 may include a third permanent magnet 230 disposed adjacent to the first transport rail 102A, a fourth permanent magnet 232 disposed adjacent to the second transport rail 102B, and a second magnet drive unit 234 for adjusting a gap between the first transport rail 102A and the third permanent magnet 230 and a gap between the second transport rail 102B and the fourth permanent magnet 232. For example, the third permanent magnet 230 may be disposed to be spaced apart from the upper surface or the inner surface of the first transport rail 102A by a predetermined distance, and the fourth permanent magnet 232 may be disposed to be spaced apart from the upper surface or the inner surface of the second transfer rail 102B by a predetermined distance. The second magnet drive unit 234 may adjust the gap between the first transport rail 102A and the third permanent magnet 230 and the gap between the second transport rail 102B and the fourth permanent magnet 232 using a linear motor, a solenoid actuator, or the like.

The first power supply 166 may provide a first drive current for an operation of the first magnet drive unit 224, and the second power supply 176 may provide a second drive current for an operation of the second magnet drive unit 234. The brake controller 180 may provide control signals for controlling the operations of the first and second magnet drive units 224 and 234 to the first and second power supplies 166 and 176 based on the signals of the front vibration sensor 182 and the rear vibration sensor 184, respectively.

Figure 8:
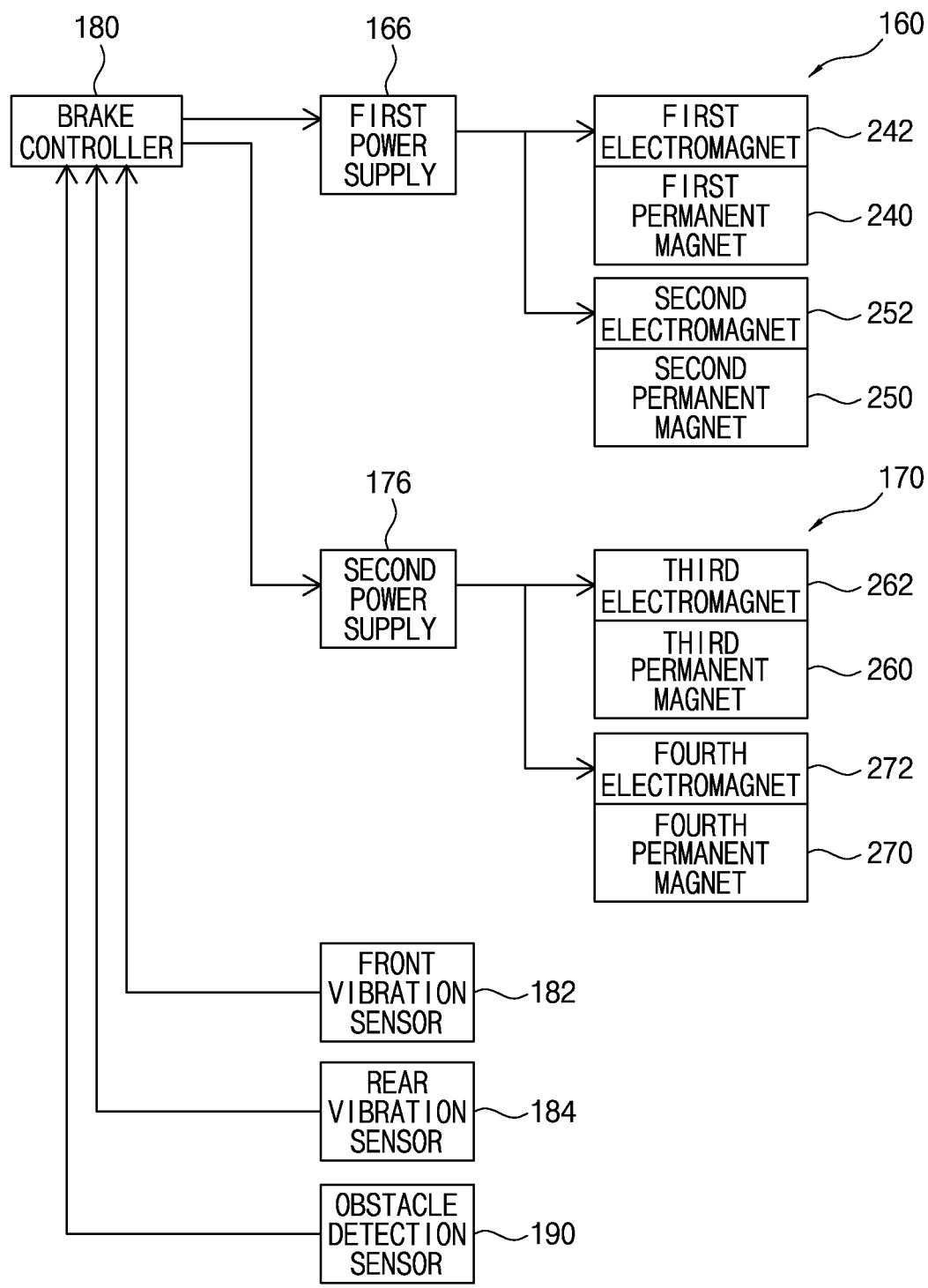
FIG. 8 is a block diagram illustrating still another example of the front brake unit and the rear brake unit as shown in FIG. 1.
Figure 9:
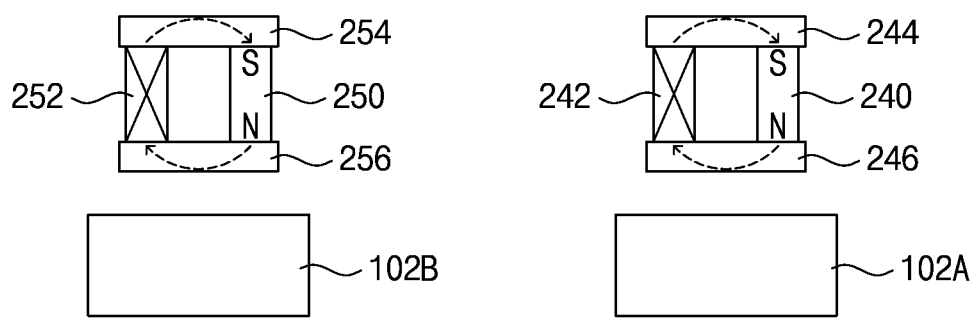
FIG. 9 is a schematic view illustrating the front brake unit as shown in FIG. 8.

FIG. 8 is a block diagram illustrating still another example of the front brake unit and the rear brake unit as shown in FIG. 1. FIG. 9 is a schematic view illustrating the front brake unit as shown in FIG. 8, and FIG. 10 is a schematic view illustrating the rear brake unit as shown in FIG. 8.

Figure 10:
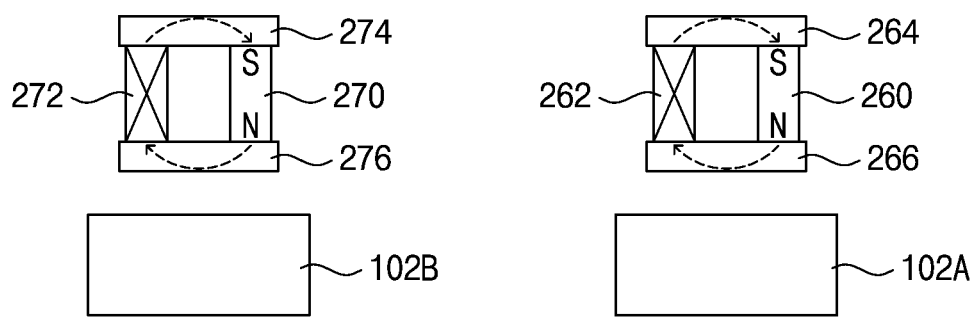
FIG. 10 is a schematic view illustrating the rear brake unit as shown in FIG. 8.

Referring to FIGS. 8 to 10, the front brake unit 160 may include a first permanent magnet 240 disposed adjacent to the first transport rail 102A, a first electromagnet 242 disposed on one side of the first permanent magnet 240, first pole pieces 244 and 246 connecting ends of the first permanent magnet 240 and the first electromagnet 242 to each other, a second permanent magnet 250 disposed adjacent to the second transport rail 102B, a second electromagnet 252 disposed on one side of the second permanent magnet 250, second pole pieces 254 and 256 connecting ends of the second permanent magnet 250 and the second electromagnet 252 to each other.

The rear brake unit 170 may include a third permanent magnet 260 disposed adjacent to the first transport rail 102A, a third electromagnet 262 disposed on one side of the third permanent magnet 260, third pole pieces 264 and 266 connecting ends of the third permanent magnet 260 and the third electromagnet 262 to each other, a fourth permanent magnet 270 disposed adjacent to the second transport rail 102B, a fourth electromagnet 272 disposed on one side of the fourth permanent magnet 270, fourth pole pieces 274 and 276 connecting ends of the fourth permanent magnet 270 and the fourth electromagnet 272 to each other.

The first power supply 166 may apply a first brake current to the first electromagnet 242 and the second electromagnet 252, and the second power supply 176 may apply a second brake current to the third electromagnet 262 and the fourth electromagnet 272. The brake controller 180 may control the first and second brake currents based on the signals from the front and rear vibration sensors 182 and 184, respectively.

In particular, when the obstacle is detected by the obstacle detection sensor 190, in order to rapidly brake the transport vehicle 104, the brake controller 180 may control the first and second brake currents so that magnetic fields formed by the first, second, third and fourth electromagnets 242, 252, 262 and 272 overlap magnetic fields formed by the first, second, third and fourth permanent magnets 240, 250, 260 and 270, as shown in FIG. 9, respectively. Accordingly, the time required for braking the transport vehicle 104 may be significantly reduced.

As another example, when the transport vehicle 104 moves normally, in order to remove the eddy current braking force generated by the first, second, third, and fourth permanent magnets 240, 250, 260 and 270, the brake controller 180 may control the first and second brake currents so that the magnetic fields formed by the first, second, third and fourth permanent magnets 240, 250, 260 and 270 are cancelled by the magnetic fields formed by the first, second, third and fourth electromagnets 242, 252, 262 and 272, respectively.

In accordance with the embodiments of the present invention as described above, the vibration generated during movement of the transport vehicle 104 may be reduced by the eddy current braking force provided by the front and rear brake units 160 and 170.

Further, when the deceleration or stop of the transport vehicle 104 is required, the time required for braking the transport vehicle 104 may be significantly reduced by the front and rear brake units 160 and 170. Particularly, when sudden braking of the transport vehicle 104 is required, the braking time may be shortened by the front and rear brake units 160 and 170, and the vibration generated during sudden braking of the transport vehicle 104 may be quickly removed by the front and rear brake units 160 and 170.

Although the example embodiments of the present invention have been described with reference to the specific embodiments, they are not limited thereto. Therefore, it will be readily understood by those skilled in the art that various modifications and changes can be made thereto without departing from the spirit and scope of the appended claims.

The invention claimed is:

1. A transport apparatus comprising:
a first transport rail and a second transport rail extending parallel to each other along a predetermined path;
a transport vehicle comprising a drive module disposed on the first and second transport rails and configured to be movable along the first and second transport rails to transport a material; and
a brake unit mounted on the transport vehicle to be adjacent to the first and second transport rails and configured to apply an eddy current braking force to the transport vehicle,
wherein the drive module comprises:
a front drive unit comprising front wheels respectively disposed on the first and second transport rails; and
a rear drive unit comprising rear wheels respectively disposed on the first and second transport rails, and
wherein the brake unit comprises:
a front brake unit mounted on the front drive unit; and
a rear brake unit mounted on the rear drive unit,
wherein the front brake unit comprises:
a first permanent magnet disposed adjacent to the first transport rail;
a first electromagnet disposed on one side of the first permanent magnet;
first pole pieces connecting ends of the first permanent magnet and the first electromagnet to each other; and
a second permanent magnet disposed adjacent to the second transport rail;
a second electromagnet disposed on one side of the second permanent magnet;
second pole pieces connecting ends of the second permanent magnet and the second electromagnet to each other, and
wherein the rear brake unit comprises:
a third permanent magnet disposed adjacent to the first transport rail;
a third electromagnet disposed on one side of the third permanent magnet;
third pole pieces connecting ends of the third permanent magnet and the third electromagnet to each other; and
a fourth permanent magnet disposed adjacent to the second transport rail;
a fourth electromagnet disposed on one side of the fourth permanent magnet;
fourth pole pieces connecting ends of the fourth permanent magnet and the fourth electromagnet to each other.

2. The transport apparatus of claim 1, further comprising:
a vibration sensor mounted on the transport vehicle and configured to sense vibration of the transport vehicle; and
a brake controller for controlling an operation of the brake unit based on a signal from the vibration sensor.

3. The transport apparatus of claim 2, wherein the brake unit comprises:
a power supply for applying a first brake current to the first electromagnet and the second electromagnet, and
the brake controller controls an operation of the power supply based on the signal from the vibration sensor.

4. The transport apparatus of claim 2, wherein the brake unit further comprises:
a magnet drive unit for adjusting a gap between the transport rail and the permanent magnet, and
the brake controller controls an operation of the magnet drive unit based on the signal from the vibration sensor.

5. A transport apparatus comprising:
a first transport rail and a second transport rail extending parallel to each other along a predetermined transport path;
a transport vehicle comprising a drive module disposed on the first and second transport rails and configured to be movable along the first and second transport rails, and a hoist module connected to the drive module and configured to elevate a material; and
brake units mounted on the drive module to be adjacent to the first and second transport rails and configured to apply an eddy current braking force to the drive module,
wherein the drive module comprises:
a front drive unit comprising front wheels respectively disposed on the first and second transport rails; and
a rear drive unit comprising rear wheels respectively disposed on the first and second transport rails, and
wherein the brake units comprise:
a front brake unit mounted on the front drive unit; and
a rear brake unit mounted on the rear drive unit,
wherein the front brake unit comprises:
a first permanent magnet disposed adjacent to the first transport rail;
a first electromagnet disposed on one side of the first permanent magnet;
first pole pieces connecting ends of the first permanent magnet and the first electromagnet to each other; and
a second permanent magnet disposed adjacent to the second transport rail;
a second electromagnet disposed on one side of the second permanent magnet;
second pole pieces connecting ends of the second permanent magnet and the second electromagnet to each other, and
wherein the rear brake unit comprises:
a third permanent magnet disposed adjacent to the first transport rail;
a third electromagnet disposed on one side of the third permanent magnet:
third pole pieces connecting ends of the third permanent magnet and the third electromagnet to each other; and
a fourth permanent magnet disposed adjacent to the second transport rail:
a fourth electromagnet disposed on one side of the fourth permanent magnet;
fourth pole pieces connecting ends of the fourth permanent magnet and the fourth electromagnet to each other.

6. The transport apparatus of claim 5, further comprising:
a front vibration sensor mounted on the front drive unit and configured to sense vibration of the front drive unit;
a rear vibration sensor mounted on the rear drive unit and configured to sense vibration of the rear drive unit; and
a brake controller for controlling an operation of the front brake unit based on a signal from the front vibration sensor and controlling an operation of the rear brake unit based on a signal from the rear vibration sensor.

7. The transport apparatus of claim 6, wherein the front brake unit comprises:
a first electromagnet disposed adjacent to the first transport rail;
a second electromagnet disposed adjacent to the second transport rail; and
a first power supply for applying a first brake current to the first electromagnet and the second electromagnet, the rear brake unit comprises:

a third electromagnet disposed adjacent to the first transport rail;
a fourth electromagnet disposed adjacent to the second transport rail; and
a second power supply for applying a second brake current to the third electromagnet and the fourth electromagnet, and
the brake controller controls the first and second brake currents based on the signals from the first and second vibration sensors, respectively.

8. The transport apparatus of claim 6, wherein the front brake unit further comprises:
a first magnet drive unit for adjusting a gap between the first transport rail and the first permanent magnet and a gap between the second transport rail and the second permanent magnet,
the rear brake unit further comprises:
a second magnet drive unit for adjusting a gap between the first transport rail and the third permanent magnet and a gap between the second transport rail and the fourth permanent magnet.

9. The transport apparatus of claim 6, wherein the front brake unit further comprises:
a first power supply for applying a first brake current to the first electromagnet and the second electromagnet,
a second power supply for applying a second brake current to the third electromagnet and the fourth electromagnet, and
the brake controller controls the first and second brake currents based on the signals from the first and second vibration sensors, respectively.

10. The transport apparatus of claim 5, further comprising:
an obstacle detection sensor mounted on a front portion of the transport vehicle and configured to detect an obstacle in front of the transport vehicle; and
a brake controller configured to control operations of the brake units so that the eddy current braking force is applied to the drive module by the brake units when the obstacle is detected by the obstacle detection sensor while the transport vehicle is moving.

11. The transport apparatus of claim 5, further comprising:
a second brake unit mounted on the hoist module to be adjacent to the first and second transport rails and configured to apply an eddy current braking force to the hoist module.

12. The transport apparatus of claim 11, further comprising:
a lower vibration sensor mounted on the hoist module and configured to sense vibration of the hoist module; and
a brake controller for controlling an operation of the second brake unit based on a signal from the lower vibration sensor.

13. The transport apparatus of claim 5, wherein the drive module comprises:
a front drive unit comprising front wheels respectively disposed on the first and second transport rails, a front motor for rotating the front wheels, and a front servo drive for controlling a torque of the front motor;
a rear drive unit comprising rear wheels respectively disposed on the first and second transport rails, a rear motor for rotating the rear wheels, and a rear servo drive for controlling a torque of the rear motor; and
a motion controller for providing a torque command to the front servo drive and the rear servo drive.

14. The transport apparatus of claim 13, wherein the front drive unit further comprises a front encoder for measuring a number of revolutions of the front motor,
the rear drive unit further comprises a rear encoder for measuring a number of revolutions of the rear motor, and
the motion controller controls operations of the front and rear motors in a feedback manner based on a signal of any one of the front and rear encoders.

15. The transport apparatus of claim 14, wherein the motion controller controls the operations of the front and rear motors in the feedback manner based on a signal from the front encoder when the transport vehicle accelerates or when the transport vehicle moves upward in an uphill section of the first and second transport rails.

16. The transport apparatus of claim 14, wherein the motion controller controls the operations of the front and rear motors in the feedback manner based on a signal from the rear encoder when the transport vehicle decelerates or when the transport vehicle moves downward in a downhill section of the first and second transport rails.

17. The transport apparatus of claim 13, further comprising:
a brake controller for controlling operations of the brake units,
wherein the motion controller provides a brake command to the brake controller to decelerate or stop the transport vehicle, and
the brake controller controls the operations of the brake units so that the eddy current braking force is applied to the drive module according to the brake command.

18. The transport apparatus of claim 13, further comprising:
an obstacle detection sensor mounted on a front portion of the transport vehicle and configured to detect an obstacle in front of the transport vehicle; and
a brake controller for controlling operations of the brake units,
wherein the motion controller provides a brake command to the brake controller to decelerate or stop the transport vehicle when the obstacle is detected by the obstacle detection sensor, and
the brake controller controls the operations of the brake units so that the eddy current braking force is applied to the drive module according to the brake command.

19. A transport apparatus comprising:
a first transport rail and a second transport rail extending parallel to each other along a predetermined transport path;
a transport vehicle comprising a drive module disposed on the first and second transport rails and configured to be movable along the first and second transport rails, and a hoist module connected to the drive module and configured to elevate a material;
brake units mounted on the drive module to be adjacent to the first and second transport rails and configured to apply an eddy current braking force to the drive module;
a second brake unit mounted on the hoist module to be adjacent to the first and second transport rails and configured to apply an eddy current braking force to the hoist module;
at least one vibration sensor mounted on the transport vehicle and configured to sense vibration of the transport vehicle; and a brake controller for controlling operations of the brake units and the second brake unit based on a signal from the at least one vibration sensor, wherein the drive module comprises;

a front drive unit comprising front wheels respectively disposed on the first and second transport rails, and a rear drive unit comprising rear wheels respectively disposed on the first and second transport rails, and wherein the brake units comprise:

a front brake unit mounted on the front drive unit; and a rear brake unit mounted on the rear drive unit, wherein the front brake unit comprises:

a first permanent magnet disposed adjacent to the first transport rail;

a first electromagnet disposed on one side of the first permanent magnet:

first pole pieces connecting ends of the first permanent magnet and the first electromagnet to each other; and a second permanent magnet disposed adjacent to the second transport rail;

a second electromagnet disposed on one side of the second permanent magnet;

second pole pieces connecting ends of the second permanent magnet and the second electromagnet to each other, and wherein the rear brake unit comprises:

a third permanent magnet disposed adjacent to the first transport rail;

a third electromagnet disposed on one side of the third permanent magnet;

third pole pieces connecting ends of the third permanent magnet and the third electromagnet to each other; and a fourth permanent magnet disposed adjacent to the second transport rail;

a fourth electromagnet disposed on one side of the fourth permanent magnet;

fourth pole pieces connecting ends of the fourth permanent magnet and the fourth electromagnet to each other.

\* \* \* \* \*